(12) United States Patent
Nolan (10) Patent No.: US 6,218,900 B1
(45) Date of Patent: Apr. 17, 2001

(54) OPERATIONAL AMPLIFIER PHASE REVERSAL PROTECTION

(75) Inventor: Jim Nolan, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/537,626

(22) Filed: Mar. 29, 2000

(51) Int. Cl.[7] .............................. H03F 3/45; H03F 3/16; H02H 7/20; G01R 19/00

(52) U.S. Cl. .................. 330/255; 330/298; 330/300; 327/52

(58) Field of Search .................. 330/255, 292, 330/298, 300; 327/52

(56) References Cited

U.S. PATENT DOCUMENTS

| | | | |
|---|---|---|---|
| 3,990,020 | * 11/1976 | Porter, III | 330/207 P |
| 4,338,573 | * 7/1982 | Van Den Bungelaar et al. | 330/298 |
| 4,823,227 | * 4/1989 | Grant | 361/90 |
| 4,866,398 | * 9/1989 | Gulczynski | 330/255 |
| 4,871,980 | * 10/1989 | Gulczynski | 330/255 |

* cited by examiner

Primary Examiner—Robert Pascal
Assistant Examiner—Patricia T. Nguyen
(74) Attorney, Agent, or Firm—Baker Botts L.L.P.

(57) ABSTRACT

An integrated circuit operational amplifier (op amp) is protected from input voltage levels which may cause output phase reversal of the op amp. Voltage comparators monitor the input voltages to the op amp differential input transistor pair. The op amp and comparators may be fabricated on an integrated circuit substrate and packaged in an integrated circuit package. When the input voltage is of such a value which may cause output phase reversal, a comparator senses same and is coupled to circuits within the op amp which prevent the op amp output voltage from going into phase reversal.

26 Claims, 5 Drawing Sheets

OPERATIONAL AMPLIFIER PHASE REVERSAL PROTECTION

FIELD OF THE INVENTION

This invention relates generally to integrated circuit operational amplifiers, and more particularly, to protecting inputs of an operational amplifier circuit having bipolar or junction field effect transistor inputs.

BACKGROUND OF THE RELATED TECHNOLOGY

An operational amplifier (op amp) is a high gain electronic amplifier having its gain controlled by negative feedback. Op amps are utilized in most analog electronic circuits and have become a major building block in electronic systems having sensor interfaces, low pass, high pass or band pass filters; programmable gain amplifiers, instrumentation amplifiers, input isolation amplifiers for analog-to-digital converters, and output amplifiers for digital-to-analog converters. A more thorough description of operational amplifier topologies and specifications may be found in Microchip Technology Inc., application note AN722 which is incorporated by reference herein.

The input stage for an op amp includes a pair of differentially connected transistors that receive differential input signals and provide corresponding differential currents to an active load. The inputs of bipolar transistor or junction field effect transistor (JFET) op amps are connected to a transistor junction, rather than to an insulated gate as in metal oxide semiconductor (MOS) transistor technology. The bipolar or JFET type op amps can exhibit an undesirable characteristic known as phase reversal should either of the transistor junctions associated with the op amp inputs become forward biased. The transistor junctions become forward biased if the inputs thereto are above or below the voltage supply rails. If this condition should occur, a large reverse current flows (if a bipolar junction) and causes the op amp output to switch to an incorrect state.

The phase of the input signals is a relative term and is defined by the polarity of one signal with respect to the other signal. An op amp is in phase when the phases of the input signals and differential currents of the op amp are the same. Phase reversal of an op amp occurs when the phase of the differential currents is opposite the phase of the input signals. The amplifier operates over a Common Mode Range (CMR) of input signals that lie between the high and low supply voltages. In the case of a single-voltage to ground supply, the CMR includes one of the supply voltages, typically the low supply which is commonly ground reference potential. If one of the input signals is driven outside of the CMR due to noise or improper drive circuitry, the corresponding differential transistor will either turn off or form a forward biased parasitic diode. When the transistor junction forward biases, the phase of the differential currents reverses with respect to the phase of the input signals and may cause the op amp to malfunction and latch up (stop working).

Most bipolar and JET op amps have additional circuitry to protect against phase reversal. A pair of phase compensation diodes may be cross-couple connected between the differential inputs and the other differential transistors' collectors to prevent phase reversal of the amplifier. When either one of the differential transistors' collector-base junctions is forward biased, the corresponding cross-coupled diode conducts and prevents a phase reversal of the differential currents. However, this type of phase reversal prevention greatly increases the magnitudes of the differential currents, on the order of twenty to thirty times the normal current values. Although op amp failure is less likely to occur, these extremely high current levels can still cause the active load to malfunction and latch up the op amp.

These phase reversal protection diodes at the inputs of the op amp are supposed to conduct before the input diode junctions of the differential input transistors of the op amp, thus clamping the signal paths to maintain the correct output state. Therefore, the input diode junctions cannot be forward biased, thus no phase reversal. This solution is limited in that the clamping diodes must have a forward voltage drop of less than the input diode junctions of the differential input transistors of the op amp. A diode's forward voltage is proportional to the natural log of the diode area, so the protection diodes may be quite large in area on the silicone substrate because an allowance of some margin for a smaller diode forward voltage than the input differential pair must be used. This requirement for the protection diodes forward voltage drop and increased area requirements may require additional processing steps in the fabrication of the op amp, or changes to the input differential transistor pair of the op amp.

It may also limit the amount of forward current that the op amp input can handle before phase reversal may occur. Conduction or turn on of the protection diodes is relatively gradual and varies significantly with temperature, thus making the clamping threshold of these diodes imprecise.

Figure 1:
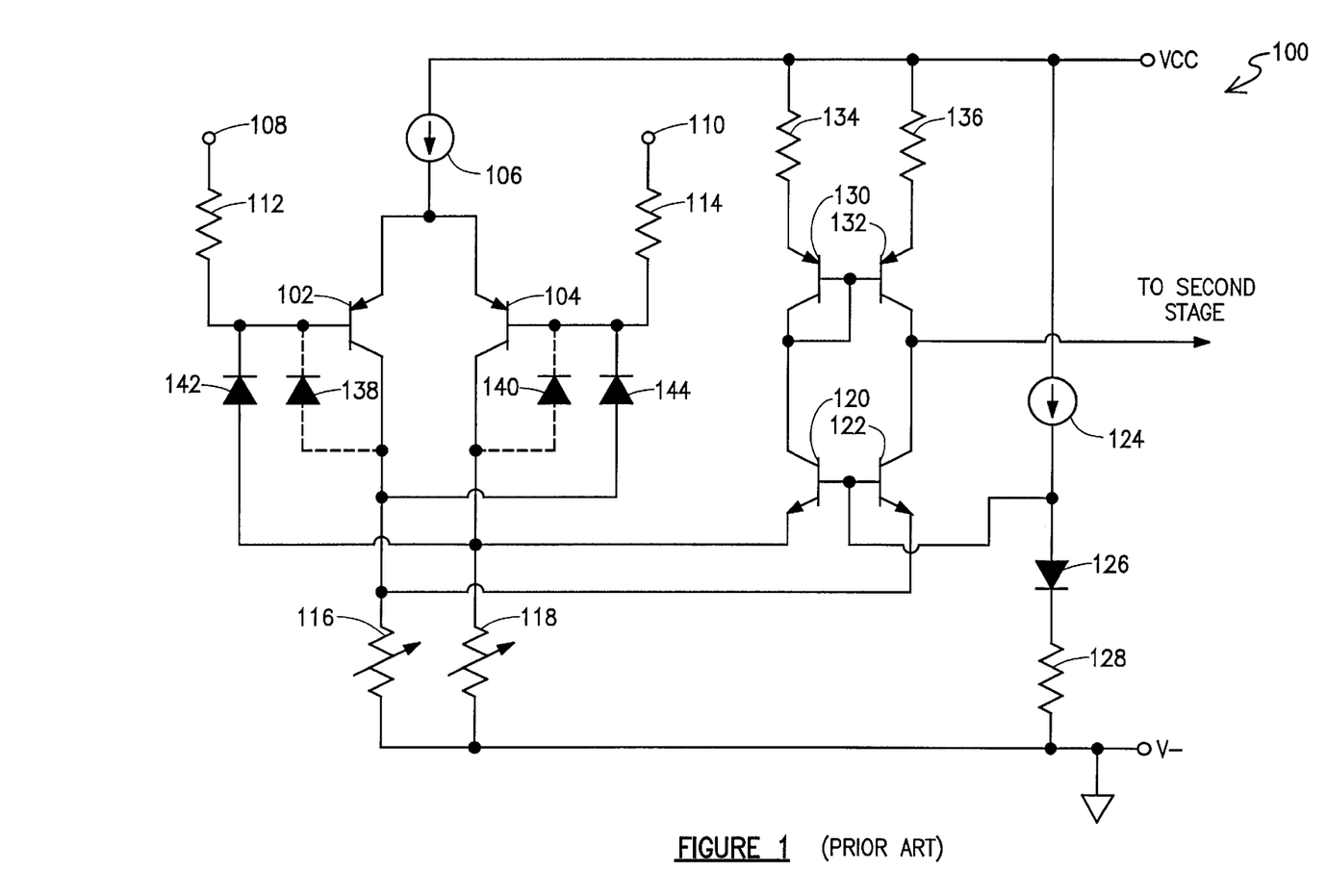
FIG. 1 is schematic diagram of a prior art operational amplifier input stage having diode phase reversal protection.

Referring to FIG. 1, a prior art schematic diagram of an operational amplifier input stage having diode phase reversal protection is illustrated. A typical single power supply (ground and a positive voltage) input stage of a bipolar transistor integrated circuit operational amplifier (op amp) is generally indicated by the numeral 100. One skilled in the art of analog integrated circuits would also recognize replacement of the bipolar transistors with junction field effect transistors, also contemplated herein and within the scope of the present invention.

The op amp input stage 100 includes cross-coupled phase compensation diodes for preventing phase reversal, and current compensation diodes for preventing overshoot of the differential currents. A pair of differentially connected transistors 102 and 104, which can be either bipolar or junction field effect transistors (JFETs), have their current circuits connected together on one side to divide the output of a current source 106. As used herein, a transistor's "current circuit" refers to the collector-emitter circuit of a bipolar transistor, or the source-drain circuit of a JFET; a transistor's "control circuit" refers to the base of a bipolar device, or the gate of an JFET. In the circuit illustrated in FIG. 1, the differential transistors are bipolar pnp transistors.

Input terminals 108 and 110 are adapted to receive differential input signals through series resistors 112 and 114. In the manner characteristic of differential amplifiers, the transistors 102 and 104 divide the current from the current source 106 in mutual opposition, with the amount of current through each of the transistors 102 and 104 varying according to the relative input voltage signals applied to their bases from the input terminals 108 and 110, respectively. If a constant, known bias is applied to one of the input transistor bases, the magnitude of the signal at the base of the other input transistor can be determined by the amount of current flowing through that transistor.

The input current source 106 operates from a positive voltage supply, $V_{cc}$, while the collectors of the pnp input transistors 102 and 104 are connected to a negative voltage supply V− (preferably ground potential) through respective series-connected first and second trimmable input resistors 116 and 118. The trimmable resistors 116 and 118 may be used to minimize any offset voltage of the input circuit.

The input stage includes a folded cascode pair of active load npn bipolar transistors 120 and 122, whose emitters are connected to the collectors of input transistors 104 and 102, respectively. The bases of transistors 120 and 122 are connected together for common biasing. A bias circuit for the transistors 120 and 122 consists of a current source 124 that is connected to the bases of the transistors 120 and 122 and to a diode 126, which is connected through resistor 128 to ground potential. Diode 128 can be a diode-connected transistor. The magnitudes and relative phase of the currents flowing through the current circuits of transistors 120 and 122 are controlled by the base-emitter voltages, which are determined by the bias voltages at their bases and by the voltages across resistors 116 and 118. The base-emitter voltages control the bias current for the transistors 120 and 122.

The active load is formed by a pair of pnp transistors 130 and 132, whose emitters are connected to $V_{cc}$ through resistors 134 and 136, respectively, and whose bases are connected together for common biasing. The transistor 130 base and collector are connected to the transistor 120 collector, and the transistor 132 collector is connected to the transistor 122 collector. The output current to the second stage (not illustrated) of the op amp is taken at the collector of transistor 132. The transistors 130 and 132 are connected as a current mirror, with the current through transistor 132 mirroring that through transistor 130. Any imbalance in the input signals at inputs 108 and 110 causes an imbalance in the currents through the transistors 120 and 122. The output current to the second stage reconciles the equal currents through transistors 130 and 132 with any current imbalance between transistors 120 and 122. As the input signal at the input 108 or 110 is decreased relative to the other input signal, the respectively connected transistor 102 or 104 collector current increases, which causes the respective resistor voltage to increase. However, if one of the input voltages at input 108 or 110 falls more than a diode drop below the voltage across respective resistor 116 or 118, the collector-base pn junction of its respective input transistor 102 or 104 becomes forward biased. This creates a parasitic diode 138 or 140 that reverses the current flow through the collector-base junction, which decreases the voltage across resistor 116 or 118 and reverses the phase of the cascode transistors 102 and 104 currents such that the amplifier is phase reversed. As one of the differential inputs 108 or 10 is decreased, the respective resistor voltage should increase, but the existence of the forward biased parasitic diode causes the resistor voltage to decrease instead and results in phase reversal of the amplifier. For bipolar differential transistors, the input stage is typically biased so that phase reversal occurs at input signals outside the common mode rejection voltage (CMR) and below the low reference potential. For example, if the resistor voltages are biased to 80 mV, the junction will forward bias for an input of approximately −400 mV at room temperature. However, if the resistor voltages increase, it is possible that phase reversal can occur for input signals inside the CMR.

A pair of phase compensation diodes 142 and 144 are cross-coupled between the bases and collectors of the transistors 102 and 104 to prevent phase reversal of the currents flowing through the transistors 120 and 122. When one input is driven more than a diode drop below the corresponding resistor 116 or 118 voltage, the cross-coupled diode 142 or 144 connected to that input 108 or 110 conducts and reduces the voltage across the other resistor 118 or 116 to a smaller value to prevent phase reversal of the resistor voltages, and thus phase reversal of the currents in transistors 120 and 122. For the same voltage, the phase compensation diodes 142 and 144 conduct more current than the parasitic diodes 138 and 140 of the differential transistors 102 and 104, thus preventing phase reversal. In normal operation, the phase compensation diodes 142 and 144 are reverse biased and have no effect on the input circuit.

The circuit illustrated in FIG. 1 and described above is a conventional bipolar differential input op amp. While the operational amplifier 100 avoids phase reversal problems, the effect of forward biasing one of the parasitic diodes 138 or 140, and activating one of the cross-coupled diodes 142 or 144 is to reduce the voltages across the resistors 116 and 118 in response to the differential transistor's forward biased collector-base junction and the cross-coupled diode. Thus, the base-emitter voltages across the cascode transistors 120 and 122, and hence their bias currents increase so that their currents increase exponentially, on the order of twenty to thirty times their normal levels. These much higher current levels can cause the active load to malfunction and latch up the op amp.

Therefore, what is needed is a circuit to protect the bipolar or JFET transistor inputs so as to prevent phase reversal of the op amp without greatly increasing current levels in the integrated circuit op amp, and preferably to use a standard complementary metal oxide semiconductor (CMOS) process to fabricate the protection circuits thereof.

SUMMARY OF THE INVENTION

The invention overcomes the above-identified problems as well as other shortcomings and deficiencies of existing technologies by providing, in an integrated circuit bipolar or JFET op amp, protection from output phase reversal from a forward biased collector-base parasitic pn diode of the input amplifier transistor and without having to rely upon input clamping diodes. In the present invention, at least two comparators are used to compare the op amp differential input voltages to a voltage reference (ground and/or power supply voltage(s)). P-channel metal oxide semiconductor (PMOS) transistors may be used for the differential pair of the comparator because a PMOS differential pair configuration includes ground in its common mode voltage range.

These comparators have an intentional mismatch so that the comparator switch point may be adjusted below ground, but above the point where the op amp input diode junctions become forward biased. Preferably, this mismatch may be constructed by making the input transistor width to length (W/L) ratios different from each other. As the input is lowered below the switch point of the comparator, its output toggles to clamp the signal paths within the op amp so as to maintain the correct output phase state of the op amp.

It is also contemplated and within the scope of the present invention that N-channel metal oxide semiconductor (NMOS) transistors may be used to include supply voltage, $V_{DD}$, in its common mode voltage range. In this embodiment, the comparators of the present invention use NMOS transistors for the differential pair so that $V_{DD}$ is included in the common-mode range of the comparator.

In another embodiment of the invention, both PMOS and NMOS transistors are used for the differential pairs in comparators that simultaneously compare the differential input signals to both $V_{ss}$ (low supply or ground) and $V_{DD}$. If the input voltage should rise above $V_{DD}$ or below ground, the respective comparator toggles to clamp the internal op amp signal paths to maintain the correct output phase state of the op amp.

A feature of the present invention is that a pair of comparators are used to monitor signal voltages on the differential inputs of a bipolar or JFET input op amp and prevent output phase reversal if these input signals go outside of a desired range.

Another feature of the present invention is monitoring the op amp differential inputs for signals below the negative voltage or common ground reference of the power supply to the op amp by using a pair of PMOS comparators.

Still another feature of the present invention is monitoring the op amp differential inputs for signals above the positive voltage reference of the power supply to the op amp by using a pair of NMOS comparators.

Yet another feature of the present invention is monitoring the op amp differential inputs for signals below the negative voltage or common ground reference and above the positive voltage reference of the power supply to the op amp by using a pair of PMOS comparators and a pair of NMOS comparators, respectively.

Still another feature is setting the clamping voltage setpoint by adjusting the mismatch (offset) of the comparator by making the input transistor W/L ratios different from each other.

An advantage of the present invention is that the phase reversal protection comparators may be fabricated with a standard CMOS process.

Another advantage of the present invention is that its phase reversal clamp voltage is more precise than that of a simple diode circuit.

Still another advantage is that the clamping voltage is less sensitive to temperature and process variations, thus operation of the op amp is more robust.

Yet another advantage is that the input comparators of the present invention are smaller than phase reversal diodes and thus require less area on the integrated circuit die.

Features and advantages of the invention will be apparent from the following description of presently preferred embodiments, given for the purpose of disclosure and taken in conjunction with the accompanying drawings.

DETAILED DESCRIPTION OF THE PREFERRED EMBODIMENT

The invention protects an integrated circuit operational amplifier (op amp) from input voltage levels which may cause output phase reversal of the op amp. Embodiments of the invention comprise an integrated circuit op amp and voltage comparators which monitor the input voltages to the op amp differential input transistor pair. The op amp and comparators may be fabricated on an integrated circuit substrate and packaged in an integrated circuit package When the input voltage is of such a value which may cause output phase reversal, the outputs of the comparators are adapted to prevent the op amp output voltage from going into phase reversal.

Referring now to the drawings, the details of preferred embodiments of the invention are schematically illustrated. Elements in the drawings that are the same will be represented by the same numbers, and similar elements will be represented by the same numbers with a different lower case letter suffix.

Figure 2:
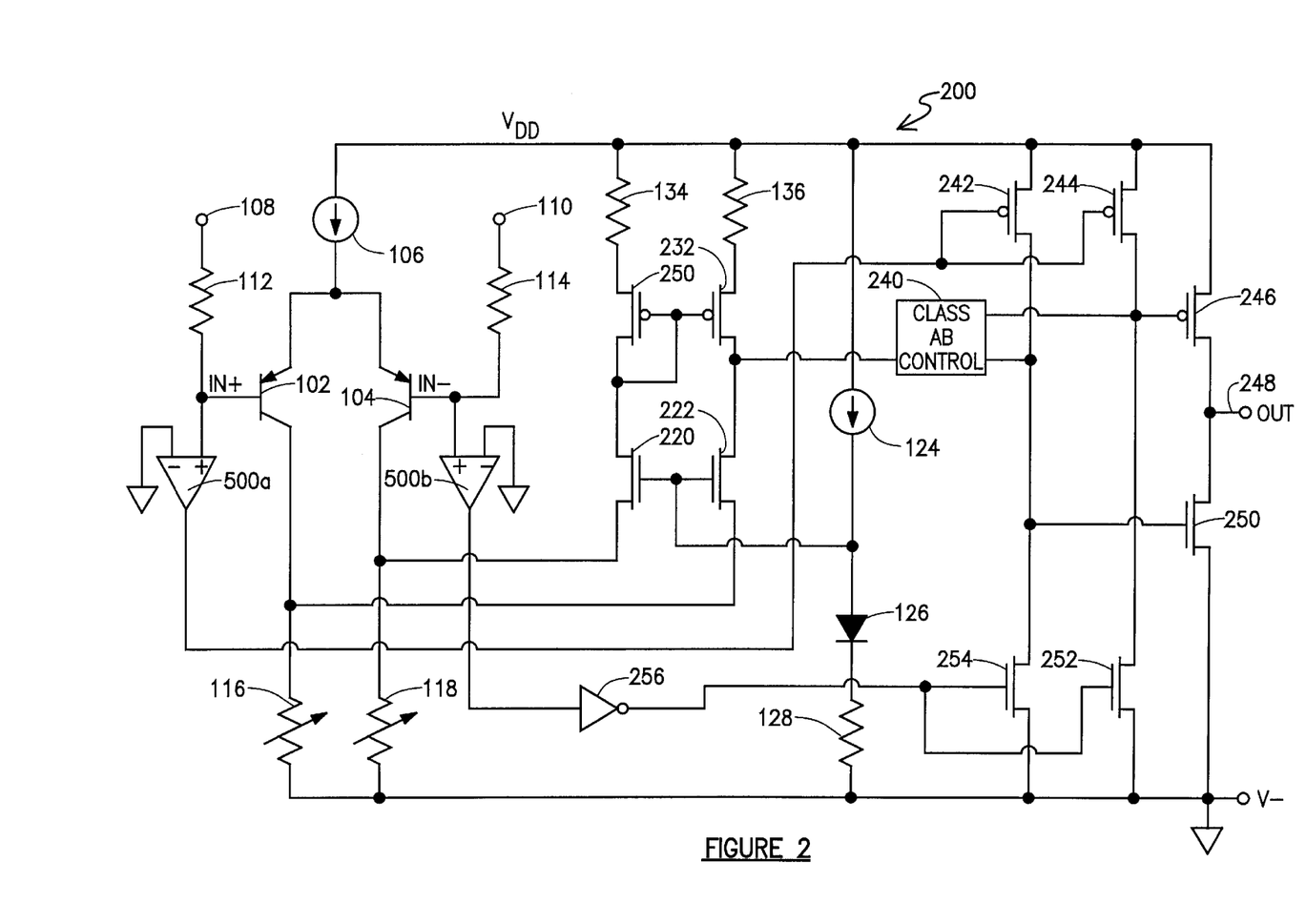
FIG. 2 is a schematic diagram of an operational amplifier according to an embodiment of the invention.

Referring to FIG. 2, a schematic diagram of an operational amplifier according to an embodiment of the invention is illustrated. This operational amplifier is generally referenced by the numeral 200. Input terminals 108 and 110 are adapted to receive differential input signals through series resistors 112 and 114. In the manner characteristic of differential amplifiers, the transistors 102 and 104 divide the current from the current source 106 in mutual opposition, with the amount of current through each of the transistors 102 and 104 varying according to the relative input voltage signals applied to their bases from the input terminals 108 and 110, respectively. If a constant, known bias is applied to one of the input transistor bases, the magnitude of the signal at the base of the other input transistor can be determined by the amount of current flowing through that transistor.

The input current source 106 operates from a positive voltage supply, $V_{DD}$, while the collectors of the pnp input transistors 102 and 104 are connected to a negative voltage supply V− (preferably ground potential) through respective series-connected first and second trimmable input resistors 116 and 118. The trimmable resistors 116 and 118 may be used to minimize any offset voltage of the input circuit.

The input stage includes a folded cascode pair of active load N-type metal oxide semiconductor (NMOS) transistors 220 and 222, whose sources are connected to the collectors of input transistors 104 and 102, respectively. The gates of transistors 220 and 222 are connected together for common biasing. A bias circuit for the transistors 220 and 222 consists of a current source 124 that is connected to the gates of the transistors 220 and 222 and to a diode 126, which is connected through resistor 128 to ground potential. Diode 128 can be a diode-connected transistor. The magnitudes and relative phase of the currents flowing through the current circuits of transistors 220 and 222 are controlled by the gate-source voltages, which are determined by the bias voltages at their gates and by the voltages across resistors 116 and 118. The gate-source voltages control the bias current for the transistors 220 and 222.

The active load is formed by a pair of P-type metal oxide semiconductor (PMOS) transistors 230 and 232, whose sources are connected to $V_{DD}$ through resistors 134 and 136, respectively, and whose gates are connected together for common biasing. The transistor 230 gate and drain are connected to the transistor 220 drain, and the transistor 232 drain is connected to the transistor 222 drain. The output current to the output stage of the op amp is taken at the drains of transistors 222 and 232. A class AB control 240 is adapted to convert the single ended output from the transistors 222 and 232 to a differential output suitable for driving the output transistors 246 and 250.

The transistors 230 and 232 are connected as a current mirror, with the current through transistor 232 mirroring that through transistor 230. Any imbalance in the input signals at the inputs 108 and 110 causes an imbalance in the currents through the transistors 220 and 222. The output current to the output stage reconciles the equal currents through transistors 230 and 232 with any current imbalance between transistors 220 and 222. As the input signal at the input 108 or 110 is decreased relative to the other input signal, the respectively connected transistor 102 or 104 collector current increases, which causes the respective resistor voltage to increase. However, if one of the input voltages at input 108 or 110 falls more than a diode drop below the voltage across respective resistor 116 or 118, the collector-base pn junction of its respective input transistor 102 or 104 will become forward biased. This creates a parasitic diode as described herein above that reverses the current flow through the collector-base junction, which decreases the voltage across resistor 116 or 118 and reverses the phase of the cascode transistors 102 and 104 currents such that the amplifier is phase reversed. As one of the differential inputs 108 or 110 is decreased, the respective resistor voltage should increase, but the existence of the forward biased parasitic diode causes the resistor voltage to decrease instead and results in phase reversal of the input stage of the op amp.

According to this embodiment of the invention, comparators 500a and 500b monitor the negative voltage values at the bases of the transistors 102 and 104, respectively. Normally, these voltages are above (a greater positive value than) the threshold switch points of the comparators 500a and 500b so that the outputs of the comparators 500a and 500b are each at a logic "1" state. When the output of the comparator 500a is at a logic 1 and PMOS transistors 242 and 244 are off, thereby not affecting the operation of the output transistor 246. When the output of the comparator 500b is at a logic 1 the inverter 256 output is at a logic 0 and NMOS transistors 242 and 244 are off, thereby not affecting the operation of the output transistor 246.

If the voltage at the input to the comparator 500a (base of transistor 102, positive differential input) goes below the comparator 500a threshold value then the output of the comparator 500a goes to a logic 0 and turns on transistors 242 and 244. When transistor 242 is on, a positive voltage is applied to the gate of output transistor 250 which effectively turns on transistor 250 (output 248 is connected to V− or ground). When transistor 244 is on, a positive voltage is applied to the gate of output transistor 246 which effectively turns off transistor 246 (output 248 is determined by the output state of transistor 250).

If the voltage at the input to the comparator 500b (base of transistor 104, negative differential input) goes below the comparator 500b threshold value then the output of the comparator 500b goes to a logic 0, the inverter 256 output goes to a logic 1 and turns on transistors 252 and 254. When transistor 254 is on, no voltage is applied to the gate of output transistor 250 which effectively turns off transistor 250 (output 248 is determined by the output state of transistor 246). When transistor 252 is on, a negative voltage (with respect to $V_{DD}$) is applied to the gate of output transistor 246 which effectively turns on transistor 246 (output 248 is connected to $V_{DD}$). Thus, the correct output phase of the op amp 200 is always maintained even when the collector-base pn junction of either transistor 102 or 104 becomes forward biased.

Figure 3:
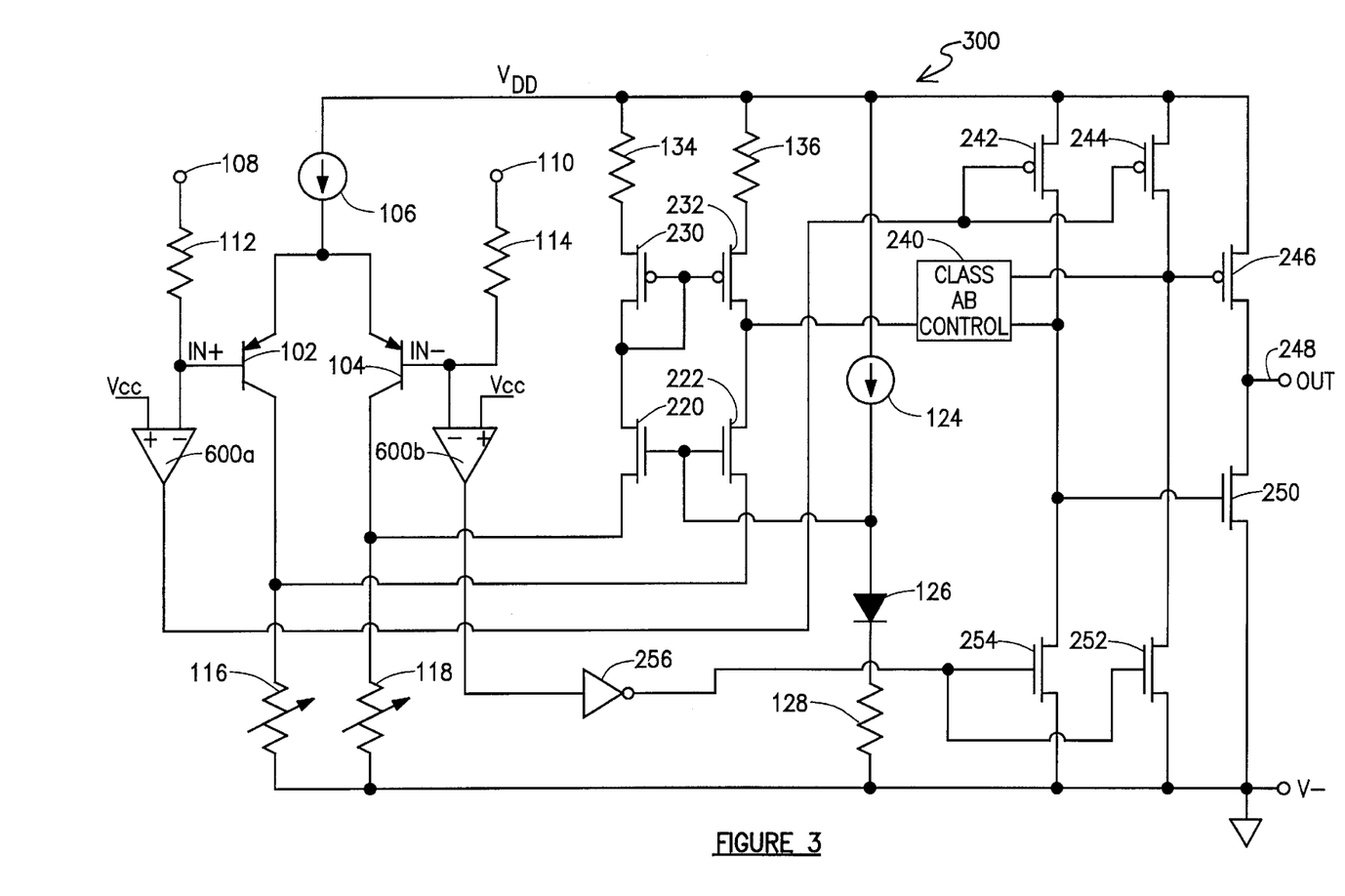
FIG. 3 is a schematic diagram of an operational amplifier according to another embodiment of the invention.

Referring to FIG. 3, a schematic diagram of an operational amplifier according to another embodiment of the invention is illustrated. This operational amplifier is generally referenced by the numeral 300. General operation of the op amp 300 is the same as described hereinabove for the op amp 200 illustrated in FIG. 2. According to this embodiment of the invention, comparators 600a and 600b monitor the positive voltage values at the bases of the transistors 102 and 104, respectively. Normally, these voltages are below (a more negative value than) the threshold switch points of the comparators 600a and 600b so that the outputs of the comparators 600a and 600b are each at a logic "1" state. When the output of the comparator 600b is at a logic 1 and PMOS transistors 242 and 244 are off, thereby not affecting the operation of the output transistor 246. When the output of the comparator 600a is at a logic 1, the inverter 256 output is at a logic 0 and NMOS transistors 242 and 244 are off, thereby not affecting the operation of the output transistor 246.

If the voltage at the input to the comparator 600b (base of transistor 104, negative differential input) goes above (more positive than $V_{DD}$) the comparator 600b threshold value then the output of the comparator 600b goes to a logic 0 and turns on transistors 242 and 244. When transistor 242 is on, a positive voltage is applied to the gate of output transistor 250 which effectively turns on transistor 250 (output 248 is connected to V− or ground). When transistor 244 is on, a positive voltage is applied to the gate of output transistor 246 which effectively turns off transistor 246 (output 248 is determined by the output state of transistor 250).

If the voltage at the input to the comparator 600a (base of transistor 102, positive differential input) goes above (more positive than $V_{DD}$) the comparator 600a threshold value then the output of the comparator 600a goes to a logic 0, the inverter 256 output goes to a logic 1 and turns on transistors 252 and 254. When transistor 254 is on, no voltage is applied to the gate of output transistor 250 which effectively turns off transistor 250 (output 248 is determined by the output state of transistor 246). When transistor 252 is on, a negative voltage (with respect to $V_{DD}$) is applied to the gate of output transistor 246 which effectively turns on transistor 246 (output 248 is connected to $V_{DD}$). Thus, the correct output phase of the op amp 200 is always maintained.

Figure 4:
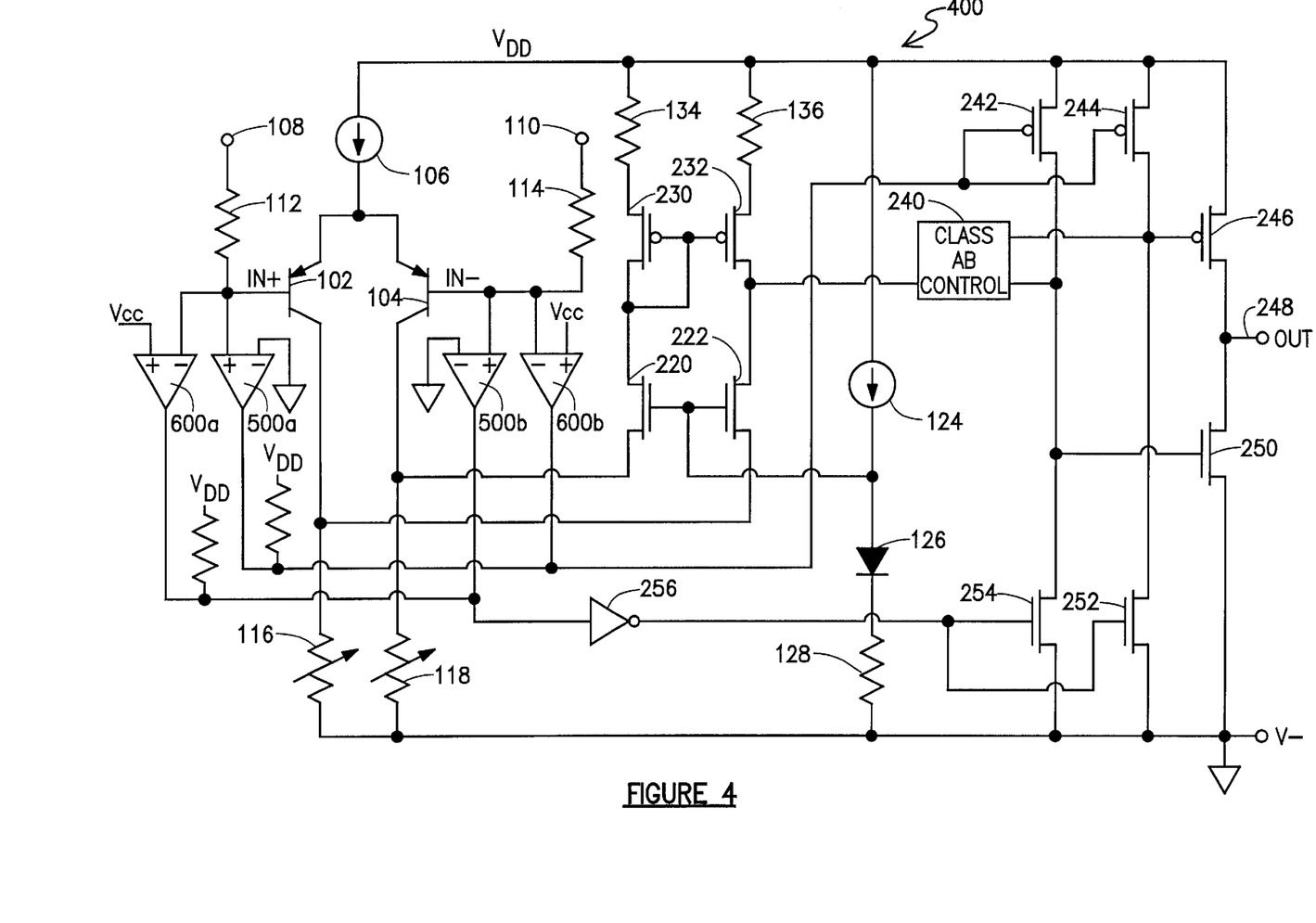
FIG. 4 is a schematic diagram of an operational amplifier according to yet another embodiment of the invention.

Referring to FIG. 4, a schematic diagram of an operational amplifier according to yet another embodiment of the invention is illustrated. This operational amplifier is generally referenced by the numeral 400. General operation of the op amp 400 is the same as described hereinabove for the op amp 200 illustrated in FIG. 2.

According to this embodiment of the invention, comparators 500a and 500b monitor the negative voltage values at the bases of the transistors 102 and 104, respectively. Normally, these voltages are above (a greater positive value than) the threshold switch points of the comparators 500a and 500b so that the outputs of the comparators 500a and 500b are each at a logic "1" state. When the output of the comparator 500a is at a logic 1 and PMOS transistors 242 and 244 are off, thereby not affecting the operation of the output transistor 246. When the output of the comparator 500b is at a logic 1 the inverter 256 output is at a logic 0 and NMOS transistors 242 and 244 are off, thereby not affecting the operation of the output transistor 246.

Comparators 600a and 600b monitor the positive voltage values at the bases of the transistors 102 and 104, respectively. Normally, these voltages are below (a more negative value than) the threshold switch points of the comparators 600a and 600b so that the outputs of the comparators 600a and 600b are each at a logic "1" state. When the output of the comparator 600b is at a logic 1 and PMOS transistors 242 and 244 are off, thereby not affecting the operation of the output transistor 246. When the output of the comparator 600a is at a logic 1, the inverter 256 output is at a logic 0 and NMOS transistors 242 and 244 are off, thereby not affecting the operation of the output transistor 246.

If the voltage at the input to the comparator 500a (base of transistor 102, positive differential input) goes below the comparator 500a threshold value then the output of the comparator 500a goes to a logic 0 and turns on transistors 242 and 244. When transistor 242 is on, a positive voltage is applied to the gate of output transistor 250 which effectively turns on transistor 250 (output 248 is connected to V− or ground). When transistor 244 is on, a positive voltage is applied to the gate of output transistor 246 which effectively turns off transistor 246 (output 248 is determined by the output state of transistor 250).

If the voltage at the input to the comparator 500b (base of transistor 104, negative differential input) goes below the comparator 500b threshold value then the output of the comparator 500b goes to a logic 0, the inverter 256 output goes to a logic 1 and turns on transistors 252 and 254. When transistor 254 is on, no voltage is applied to the gate of output transistor 250 which effectively turns off transistor 250 (output 248 is determined by the output state of transistor 246). When transistor 252 is on, a negative voltage (with respect to $V_{DD}$) is applied to the gate of output transistor 246 which effectively turns on transistor 246 (output 248 is connected to $V_{DD}$). Thus, the correct output phase of the op amp 400 is always maintained even when the collector-base pn junction of either transistor 102 or 104 becomes forward biased.

If the voltage at the input to the comparator 600b (base of transistor 104, negative differential input) goes above (more positive than $V_{DD}$) the comparator 600b threshold value then the output of the comparator 600b goes to a logic 0 and turns on transistors 242 and 244. When transistor 242 is on, a positive voltage is applied to the gate of output transistor 250 which effectively turns on transistor 250 (output 248 is connected to V− or ground). When transistor 244 is on, a positive voltage is applied to the gate of output transistor 246 which effectively turns off transistor 246 (output 248 is determined by the output state of transistor 250).

If the voltage at the input to the comparator 600a (base of transistor 102, positive differential input) goes above (more positive than $V_{DD}$) the comparator 600a threshold value then the output of the comparator 600a goes to a logic 0, the inverter 256 output goes to a logic 1 and turns on transistors 252 and 254. When transistor 254 is on, no voltage is applied to the gate of output transistor 250 which effectively turns off transistor 250 (output 248 is determined by the output state of transistor 246). When transistor 252 is on, a negative voltage (with respect to $V_{DD}$) is applied to the gate of output transistor 246 which effectively turns on transistor 246 (output 248 is connected to $V_{DD}$). Thus, the correct output phase of the op amp 400 is always maintained.

Figure 5:
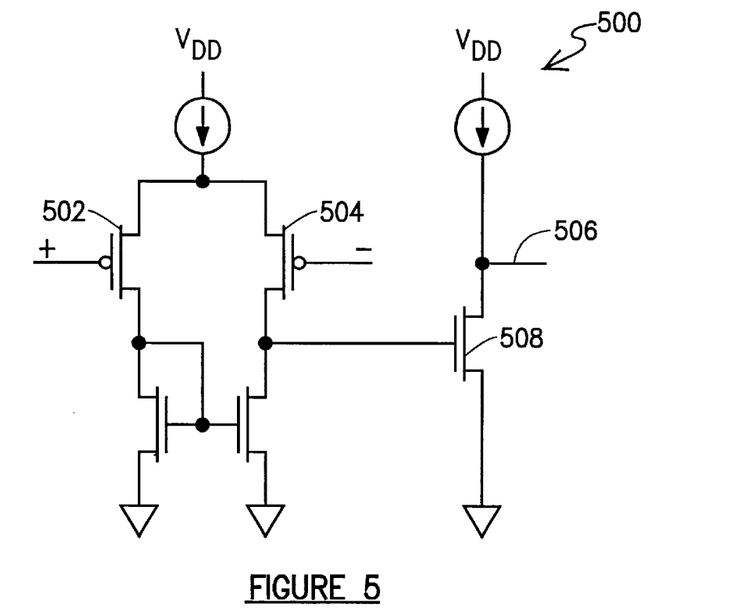
FIG. 5 is a schematic diagram of a negative sense comparator according to the embodiments of the invention.

Referring to FIG. 5, a schematic diagram of a negative sense comparator according to the embodiments of the invention is illustrated. A circuit for a negative sense comparator is generally indicated by the numeral 500. PMOS transistors 502 and 504 are used for the differential input pair of the comparator 500 since this architecture includes ground in its common mode voltage range. The comparator 500 transistors 502 and 504 have an intentional mismatch so that the switch point of the comparator 500 is adjusted below ground or V− reference, but above the point where the collector-base junctions would become forward biased. Preferably, this mismatch is constructed by making the input transistor (502 and 504) width to length W/L ratios different from each other. As the input is lowered below the switch point of the comparator 500, its output 506 toggles to ground (NMOS transistor 508 turns on).

Figure 6:
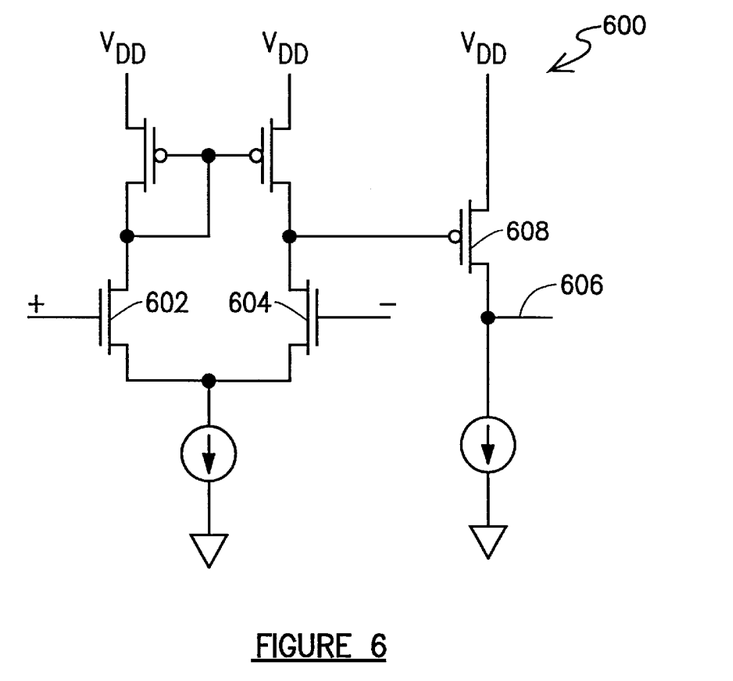
FIG. 6 is a schematic diagram of a positive sense comparator according to the embodiments of the invention.

Referring to FIG. 6, a schematic diagram of a positive sense comparator according to the embodiments of the invention is illustrated. A circuit for a positive sense comparator is generally indicated by the numeral 600. NMOS transistors 602 and 604 are used for the differential input pair of the comparator 600 since this architecture includes $V_{DD}$ in its common mode voltage range. The comparator 600 transistors 602 and 604 have an intentional mismatch so that the switch point of the comparator 600 is adjusted above $V_{DD}$, but below the point where the collector-base junctions would become forward biased. Preferably, this mismatch is constructed by making the input transistor (602 and 604) width to length W/L ratios different from each other. As the input is raised above the switch point of the comparator 600, its output 606 toggles to $V_{DD}$ (PMOS transistor 608 turns on).

The invention, therefore, is well adapted to carry out the objects and attain the ends and advantages mentioned, as well as others inherent therein. While the invention has been depicted, described, and is defined by reference to particular preferred embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention to be limited only by the spirit and scope of the appended claims, giving full cognizance to equivalents in all respects.

What is claimed is:

1. An integrated circuit operational amplifier having output phase reversal protection, comprising:

an operational amplifier having differential inputs, wherein one of the differential inputs is a positive input and the other differential input is a negative input;

a first comparator having a positive sense input connected to the positive input of the operational amplifier and sensing voltages thereon, a negative sense input connected to a first voltage and an output having first and second logic levels, wherein the output is at the first logic level when the positive sense input is at a voltage greater than or equal to the first voltage and the output is at the second logic level when the positive sense input is at a voltage less than the first voltage;

a second comparator having a positive sense input connected to the negative input of the operational amplifier and sensing voltages thereon, a negative sense input connected to the first voltage and an output having first and second logic levels, wherein the output is at the first logic level when the positive sense input is at a voltage greater than or equal to the first voltage and the output is at the second logic level when the positive sense input is at a voltage less than the first voltage;

the first comparator output is connected to first logic circuits of the operational amplifier such that when the first comparator output is at the second logic level the output of the operational amplifier is forced to a minimum voltage level; and the second comparator output is connected to second logic circuits of the operational amplifier such that when the second comparator output is at the second logic level the output of the operational amplifier is forced to a maximum voltage level.

2. The integrated circuit operational amplifier of claim 1, further comprising:

a third comparator having a negative sense input connected to the positive input of the operational amplifier and sensing voltages thereon, a positive sense input connected to a second voltage and an output having first and second logic levels, wherein the output is at the first logic level when the negative sense input is at a voltage less than or equal to the second voltage and the output is at the second logic level when the negative sense input is at a voltage greater than the second voltage;

a fourth comparator having a negative sense input connected to the negative input of the operational amplifier and sensing voltages thereon, a positive sense input connected to the second voltage and an output having first and second logic levels, wherein the output is at the first logic level when the negative sense input is at a voltage less than or equal to the second voltage and the output is at the second logic level when the negative sense input is at a voltage greater than the second voltage;

the fourth comparator output is connected to the first logic circuits of the operational amplifier such that when the fourth comparator output is at the second logic level the output of the operational amplifier is forced to the minimum voltage level; and the third comparator output is connected to the second logic circuits of the operational amplifier such that when the third comparator output is at the second logic level the output of the operational amplifier is forced to the maximum voltage level.

3. An integrated circuit operational amplifier having output phase reversal protection, comprising:

an operational amplifier having differential inputs, wherein one of the differential inputs is a positive input and the other differential input is a negative input;

a third comparator having a negative sense input connected to the positive input of the operational amplifier and sensing voltages thereon, a positive sense input connected to a second voltage and an output having first and second logic levels, wherein the output is at the first logic level when the negative sense input is at a voltage less than or equal to the second voltage and the output is at the second logic level when the negative sense input is at a voltage greater than the second voltage;

a fourth comparator having a negative sense input connected to the negative input of the operational amplifier and sensing voltages thereon, a positive sense input connected to the second voltage and an output having first and second logic levels, wherein the output is at the first logic level when the negative sense input is at a voltage less than or equal to the second voltage and the output is at the second logic level when the negative sense input is at a voltage greater than the second voltage;

the fourth comparator output is connected to first logic circuits of the operational amplifier such that when the fourth comparator output is at the second logic level the output of the operational amplifier is forced to a minimum voltage level; and the third comparator output is connected to second logic circuits of the operational amplifier such that when the third comparator output is at the second logic level the output of the operational amplifier is forced to a maximum voltage level.

4. The integrated circuit operational amplifier of claim 1, wherein the operational amplifier is comprised of bipolar input transistors.

5. The integrated circuit operational amplifier of claim 1, wherein the operational amplifier is comprised of junction field effect input transistors.

6. The integrated circuit operational amplifier of claim 1, wherein the first and second comparators are comprised of N-channel and P-channel metal oxide semiconductor field effect transistors.

7. The integrated circuit operational amplifier of claim 2, wherein the third and fourth comparators are comprised of N-channel and P-channel metal oxide semiconductor field effect transistors.

8. The integrated circuit operational amplifier of claim 1, wherein the first logic circuits force output transistors of the operational amplifier to the minimum voltage level.

9. The integrated circuit operational amplifier of claim 1, wherein the second logic circuits force output transistors of the operational amplifier to the maximum voltage level.

10. The integrated circuit operational amplifier of claim 1, wherein the minimum voltage level is at about ground.

11. The integrated circuit operational amplifier of claim 1, wherein the maximum voltage level is at about a supply voltage to the operational amplifier.

12. The integrated circuit operational amplifier of claim 1, wherein the first logic level is a logic 1 and the second logic level is a logic 0.

13. The integrated circuit operational amplifier of claim 1, wherein the first logic level is a logic 0 and the second logic level is a logic 1.

14. The integrated circuit operational amplifier of claim 1, wherein the first voltage is at about ground.

15. The integrated circuit operational amplifier of claim 1, wherein the second voltage is at about a supply voltage to the operational amplifier.

16. The integrated circuit operational amplifier of claim 1, wherein the operational amplifier, and the first and second comparators are fabricated on a single integrated circuit die.

17. The integrated circuit operational amplifier of claim 2, wherein the operational amplifier, and the first, second, third and fourth comparators are fabricated on a single integrated circuit die.

18. The integrated circuit operational amplifier of claim 1, wherein the first comparator input transistors each have a different width to length ratio.

19. The integrated circuit operational amplifier of claim 1, wherein the second comparator input transistors each have a different width to length ratio.

20. The integrated circuit operational amplifier of claim 1, wherein the third comparator input transistors each have a different width to length ratio.

21. The integrated circuit operational amplifier of claim 1, wherein the fourth comparator input transistors each have a different width to length ratio.

22. A method for protecting an integrated circuit operational amplifier from output phase reversal, the operational amplifier having positive and negative differential inputs, said method comprising the steps of:

comparing a voltage on the positive input of the operational amplifier to a first voltage with a first comparator, wherein the first comparator output is at a first logic level when the voltage on the positive input of the operational amplifier is greater than or equal to the first voltage and the first comparator output is at a second logic level when the voltage on the positive input of the operational amplifier is less than the first voltage;

comparing another voltage on the negative input of the operational amplifier to the first voltage with a second comparator, wherein the second comparator output is at a first logic level when the another voltage on the negative input of the operational amplifier is greater than or equal to the first voltage and the second comparator output is at a second logic level when the another voltage on the negative input of the operational amplifier is less than the first voltage;

forcing the operational amplifier output to a minimum voltage level when the first comparator output is at the second logic level; and forcing the operational amplifier output to a maximum voltage level when the second comparator output is at the second logic level.

23. The method of claim 22, further comprising the steps of:

comparing the voltage on the positive input of the operational amplifier to a second voltage with a third comparator, wherein the third comparator output is at a first logic level when the voltage on the positive input of the operational amplifier is less than or equal to the second voltage and the third comparator output is at a second logic level when the voltage on the positive input of the operational amplifier is greater than the second voltage;

comparing the another voltage on the negative input of the operational amplifier to the second voltage with a fourth comparator, wherein the second comparator output is at a first logic level when the another voltage on the negative input of the operational amplifier is less than or equal to the second voltage and the second comparator output is at a second logic level when the another voltage on the negative input of the operational amplifier is greater than the second voltage;

forcing the operational amplifier output to a minimum voltage level when the fourth comparator output is at the second logic level; and forcing the operational amplifier output to a maximum voltage level when the third comparator output is at the second logic level.

24. A method for protecting an integrated circuit operational amplifier from output phase reversal, the operational amplifier having positive and negative differential inputs, said method comprising the steps of:

comparing a voltage on the positive input of the operational amplifier to a second voltage with a third comparator, wherein the third comparator output is at a first logic level when the voltage on the positive input of the operational amplifier is less than or equal to the second voltage and the third comparator output is at a second logic level when the voltage on the positive input of the operational amplifier is greater than the second voltage;

comparing another voltage on the negative input of the operational amplifier to the second voltage with a fourth comparator, wherein the second comparator output is at a first logic level when the another voltage on the negative input of the operational amplifier is less than or equal to the second voltage and the second comparator output is at a second logic level when the another voltage on the negative input of the operational amplifier is greater than the second voltage;

forcing the operational amplifier output to a minimum voltage level when the fourth comparator output is at the second logic level; and forcing the operational amplifier output to a maximum voltage level when the third comparator output is at the second logic level.

25. The method of claim 23, wherein the minimum voltage level is at about ground and the maximum voltage level is at about a supply voltage to the operational amplifier.

26. The method of claim 24, wherein the minimum voltage level is at about ground and the maximum voltage level is at about a supply voltage to the operational amplifier.

* * * * *